United States Patent
Lenahan et al.

(10) Patent No.: US 8,895,865 B2
(45) Date of Patent: Nov. 25, 2014

(54) CONDUCTIVE CONNECTIONS ALLOWING XYZ TRANSLATION

(76) Inventors: Conor P. Lenahan, San Francisco, CA (US); Taylor H. Gilbert, Sunnyvale, CA (US)

( * ) Notice: Subject to any disclaimer, the term of this patent is extended or adjusted under 35 U.S.C. 154(b) by 107 days.

(21) Appl. No.: 13/607,317

(22) Filed: Sep. 7, 2012

(65) Prior Publication Data
US 2014/0073152 A1   Mar. 13, 2014

(51) Int. Cl.
*H05K 1/00*   (2006.01)
(52) U.S. Cl.
USPC ........................................................... 174/254
(58) Field of Classification Search
CPC .................................................... H01R 9/0735
USPC ................... 174/254; 439/32, 33, 627, 67, 77
See application file for complete search history.

(56) References Cited

U.S. PATENT DOCUMENTS

| | | | | |
|---|---|---|---|---|
| 3,300,572 | A | * | 1/1967 | Dahlgren et al. ................ 174/69 |
| 3,422,213 | A | * | 1/1969 | Boodley et al. ............. 174/72 R |
| 3,492,538 | A | * | 1/1970 | Fergusson ..................... 361/803 |
| 3,727,168 | A | * | 4/1973 | Henschen et al. ............ 439/498 |
| 3,818,122 | A | * | 6/1974 | Luetzow .......................... 174/86 |
| 4,113,981 | A | * | 9/1978 | Fujita et al. ................ 174/88 R |
| 4,143,931 | A | * | 3/1979 | Skare et al. ..................... 439/67 |
| 4,296,457 | A | * | 10/1981 | Hahlganss .................... 361/785 |
| 4,460,804 | A | * | 7/1984 | Svejkovsky ............... 174/117 A |
| 5,341,806 | A | * | 8/1994 | Gadsby et al. ................ 600/393 |
| 5,495,076 | A | * | 2/1996 | Davis ............................. 174/254 |
| 5,605,474 | A | * | 2/1997 | Auclair ......................... 439/505 |
| 5,742,484 | A | * | 4/1998 | Gillette et al. ................ 361/789 |
| 5,763,069 | A | | 6/1998 | Jordan |
| 6,344,616 | B1 | * | 2/2002 | Yokokawa ................. 174/117 F |
| 6,425,772 | B1 | * | 7/2002 | Bernier et al. .................. 439/91 |
| 6,743,982 | B2 | * | 6/2004 | Biegelsen et al. .............. 174/69 |
| 7,326,369 | B2 | | 2/2008 | Cheng et al. |
| 7,422,345 | B2 | * | 9/2008 | Lin .......................... 362/249.01 |
| 7,491,892 | B2 | * | 2/2009 | Wagner et al. ................ 174/254 |
| 7,629,691 | B2 | * | 12/2009 | Roush et al. ................... 257/773 |
| 7,641,488 | B2 | * | 1/2010 | Ho et al. ........................ 439/162 |
| 7,833,576 | B2 | | 11/2010 | Storbeck et al. |
| 7,948,763 | B2 | * | 5/2011 | Chuang ......................... 361/749 |
| 8,038,839 | B2 | | 10/2011 | Noda et al. |
| 8,148,627 | B2 | * | 4/2012 | Rose et al. .................... 136/244 |
| 8,269,112 | B2 | * | 9/2012 | Lee et al. ...................... 174/254 |
| 8,389,862 | B2 | * | 3/2013 | Arora et al. .................. 174/254 |
| 8,574,008 | B2 | * | 11/2013 | Große et al. .................. 439/627 |
| 2012/0097421 | A1 | | 4/2012 | Gundel |
| 2012/0206682 | A1 | | 8/2012 | Onishi et al. |
| 2012/0231638 | A1 | * | 9/2012 | Ikeda et al. ..................... 439/77 |

* cited by examiner

*Primary Examiner* — Neil Abrams
(74) *Attorney, Agent, or Firm* — Womble Carlyle Sandridge & Rice LLP (57) ABSTRACT

The embodiments relates generally to the use of conductive connections for electrically grounding a series of conductive substrates. More specifically the embodiments teach configurations of conductive connections that do not overly constrain relative motion between the connected conductive substrates. Conductive pressure sensitive adhesive is used to attach opposing ends of the conductive connectors to the conductive substrates. A substrate portion of the conductive connectors is scored by a cutting device such as a die cutter to reduce rigidity of the substrate portion.

20 Claims, 11 Drawing Sheets

CONDUCTIVE CONNECTIONS ALLOWING XYZ TRANSLATION

BACKGROUND

1. Technical Field

The embodiments relates generally to the use of conductive connections for electrically grounding a series of conductive substrates. More specifically the embodiments teach a configuration of a conductive connection that does not overly constrain relative motion between the connected conductive substrates.

2. Related Art

As electronic devices get increasingly smaller and more complex, innovative ways for cramming internal components into tighter spaces must be sought after. One way electronics manufacturers accomplish this space optimization is to stack components on top of one another. This stacking creates multiple layers of circuit boards which very commonly need to be at least grounded together. Wireless communications devices in particular can benefit when their components are electrically coupled to a grounding plane to augment antenna performance. Regardless of the grounding purpose, electrically coupling a large number of components together can be complicated given the demanding geometries seen in today's electronic devices. One known way to pass electricity from one plane to another is by means of applying conductive foam between vertically stacked layers. Unfortunately this has a number of disadvantages. First, a layer of foam can take up a significant amount of space that could otherwise be used for other components, or cooling conduits. Second, once a foam layer is applied it can substantially restrict movement between layers. Finally, it also typically requires a substantial amount of compressive force to be applied to the layer of foam to achieve a reliable connection.

Therefore, what is desired is an improved way to electrically couple vertically spaced layers closely together.

SUMMARY

This paper describes many embodiments that relate to a method and apparatuses, for grounding electronic components in a Z-direction while enabling movement of those components with respect to one another in at least the X and Y axes.

In one embodiment a method is disclosed for electrically coupling at least a first conductive substrate and a second conductive substrate. The electrically coupled first and second conductive substrates are subsequently translated within a three dimensional volume with respect to each other. The method includes at least the following steps: (1) electrically coupling a first end of a flexible conductive connector to the first conductive substrate and a second end of the flexible connector to the second conductive substrate; and (2) translating a position of the first conductive substrate to achieve the desired position within the three dimensional volume in relation to the second conductive substrate. The flexible conductive connector includes the following elements: (1) a first adhesive surface at the first end configured to attach the first conductive substrate to the flexible conductive connector; (2) a second adhesive surface at the second end configured to attach the second conductive substrate to the flexible conductive connector, and (3) a slotted body portion connecting the first and second ends, the slotted body portion permitting the first and second conductive substrates to translate with respect to each other to a desired position within the three dimensional volume; and In another embodiment a unitary flexible connector is disclosed. The unitary flexible connector is configured for electrically connecting at least a first and a second conductive substrate within a three dimensional volume. The unitary flexible connector includes at least the following: (1) a first end, the first end comprising a first adhesive surface configured to electrically couple the first end and the first conductive substrate; (2) a second end, the second end comprising a second adhesive surface configured to electrically couple the second end and the second conductive substrate; and (3) a body portion comprising a plurality of slits each being formed by removing a pre-determined amount of body portion material, wherein an amount of flexure afforded the body portion is in direct relation to the amount of removed body portion material.

In yet another embodiment a floating conductive connector is disclosed. The floating conductive connector is configured to electrically connect a first node and a second node. The first and second node are positioned at a first and second location within a three dimensional volume, respectively. The floating conductive connector includes at least the following: (1) a conductive pad; and (2) a flexible conductive member connected to the conductive pad, wherein the flexible conductive member allows the conductive pad to move within the three dimensional volume while maintaining an electrical connection between the first and second nodes.

BRIEF DESCRIPTION OF THE DRAWINGS

The embodiments will be readily understood by the following detailed description in conjunction with the accompanying drawings, wherein like reference numerals designate like structural elements, and in which.

DETAILED DESCRIPTION OF EXAMPLE EMBODIMENTS

A representative apparatus and application of methods according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Conductive electrical connections are important to many electronic devices. This is especially true in wireless devices where proper grounding of internal components can result in increased antennae performance. In many electronic devices grounding pathways can take up valuable space inside an electronic device thereby either limiting functionality of the device or requiring a larger overall device enclosure. Given modern trends to decrease device size and increase functionality, any wasted space in an electronic device is highly undesirable. When components are stacked vertically on top of one another, one known grounding solution is by applying conductive foams between components stacked vertically in a vertical (or Z) direction. Another known grounding solution is to use two sided, conductive Pressure-Sensitive Adhesive to ground vertically stacked components. Unfortunately, both conductive foam and conductive Pressure-Sensitive Adhesive tend to fix vertically arranged components at least semi-rigidly together, and adhesive foam in particular tend to takes up a not insignificant amount of space in the electronic device. One solution to this problem is to use a conductive adhesive tape construct to flexibly combine the vertically arranged components. Advantageously, conductive adhesive substrates can be quite thin and as will be further discussed below, can be arranged to provide relatively unconstrained movement between electronic components, while also providing grounding in Z.

In one embodiment a conductive connector can be embodied by a single faced conductive pressure-sensitive adhesive (PSA) substrate which is used to ground a first and second conductive substrate together. The single faced conductive PSA substrate has one adhesive side, a central portion of which is deadened so that only two end regions of the adhesive side retain adhesive properties. A number of slits can be scored into the deadened central portion of the single faced conductive PSA substrate. A first end region of the adhesive side of the single faced conductive adhesive can be attached to a first conductive substrate. An unattached end of the single faced conductive PSA substrate can then be bent over so that a second end region of the adhesive side is arranged directly above the first attached end region of the adhesive side. The second end region can then be attached to a second conductive substrate resulting in two vertically stacked conductive substrates having a grounding pathway through the conductive PSA substrate. In this way the two conductive substrates can be stacked together having only a distance of two times the thickness of the conductive PSA substrate between the conductive substrates. In some embodiments this can be as thin as about 0.1 mm. Since conductive PSA is generally flexible the conductive substrates can move in X, Y, and Z dimensions even after the two substrates are connected. The number of slits scored into the deadened central portion of the single faced conductive PSA substrate make the conductive PSA substrate even more flexible and minimize any resulting stress build up that can be caused by stretching of the conductive PSA substrate. In some embodiments little or no force can be applied by the conductive connector to the first and second conductive substrates.

In another embodiment a conductive connector can be embodied by a conductive sheet having PSA arranged on both surfaces. A portion of a central area of the conductive sheet is first die cut leaving a continuous border region extending around an edge of the die cut conductive sheet. The border region attaches to a central region located in a middle portion of the conductive sheet by a linking region which is made up of a number of conductive strands. The conductive strands are generally configured in a non-linear pattern (in some cases a limited number of strands can have a linear configuration). In one embodiment the conductive strands can be configured with a number of curves, while in another the conductive strands can take the shape of saw teeth, or even sinusoids. A PSA patch matching the central region of the conductive sheet is applied within the central region on one side of the conductive sheet. A PSA ring matching the border region of the conductive sheet is applied within the border region on another side of the conductive sheet. By sandwiching the resulting conductive connector between two conductive substrates they can be electrically coupled. Because the PSA ring and PSA patch are not stacked directly on top of one another the conductive connector can have a thickness equal to the PSA thickness plus the thickness of the conductive sheet. In embodiments where the conductive sheet is substantially smaller than the PSA, a conductive connector having a thickness of about the same depth as a single PSA layer is possible. This conductive connector has a substantial advantage over a conventional piece of conductive PSA since the conductive sheet and its conductive strands allow relative movement between the two conductive substrates.

These and other embodiments are discussed below with reference to FIGS. 1-8; however, those skilled in the art will readily appreciate that the detailed description given herein with respect to these figures is for explanatory purposes only and should not be construed as limiting.

Figure 1:
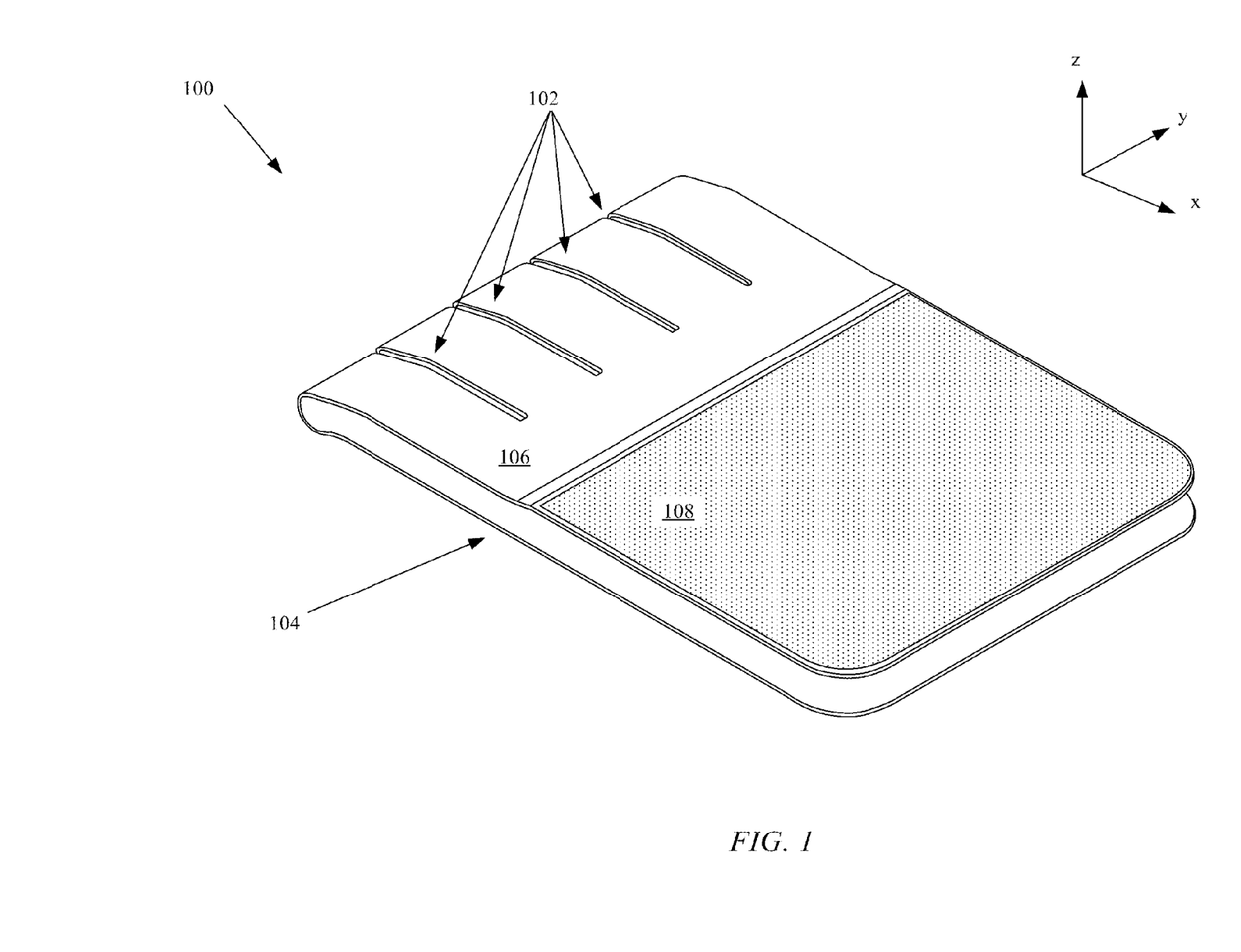
FIG. 1 shows a perspective view of one embodiment of a conductive connector.

A conductive connector can take many forms. For example, FIG. 1 shows one embodiment of a conductive connector for connecting two conductive substrates. In this embodiment a single faced pressure sensitive adhesive (PSA) tape 100 has been scored in four places to form slits 102 which are also sometimes referred to as slots. Scoring can be accomplished by way of a die cutting operation. While four slits 102 are depicted fewer or more slits 102 are certainly possible, and within the scope contemplated by embodiments described within this application. In one embodiment single faced PSA tape 100 can be based on an acrylic PSA substrate 104 (it should be noted that while acrylic PSA is used for the balance of this particular embodiment, any PSA tape material can be used and the specific use of acrylic tape in no way limits the scope of this embodiment). Acrylic PSA has many advantages including sufficient tack so as not to require a tackifier to be added to it. Such a property can reduce production costs of the PSA. Since PSA tape 100 is single faced it only sticks on one side; furthermore, in this particular embodiment only a small portion of the outer surface is sticky. Selective application, sometimes referred to as deadening is accomplished by deadening PSA on surface region 106. Surface region 106 extends from a top surface around to a lower surface, not including adhesive surface regions 108. It should be noted that the lower adhesive region is not represented in this depiction but is located on a lower surface of acrylic PSA substrate 104, directly below depicted adhesive surface region 108. Deadening can be accomplished in a number of ways. For example, in one embodiment a lamination layer can be added to surface region 106, thereby neutralizing adhesive properties in that region. In some cases the lamination layer can be an unreleased release liner left on surface region 106, obscuring the acrylic PSA located underneath. In one embodiment adhesive PSA tape 100 can extend only 0.4 mm in the Z-axis, thereby allowing adhesive PSA tape 100 to take up only a minimum amount of space between attachment members. Moreover, in some cases a slight gap between conductive substrates is desirable where other components are routed through the slight gap created. In one embodiment single faced PSA tape 100 can extend 4 mm in the Y-axis.

Figure 2:
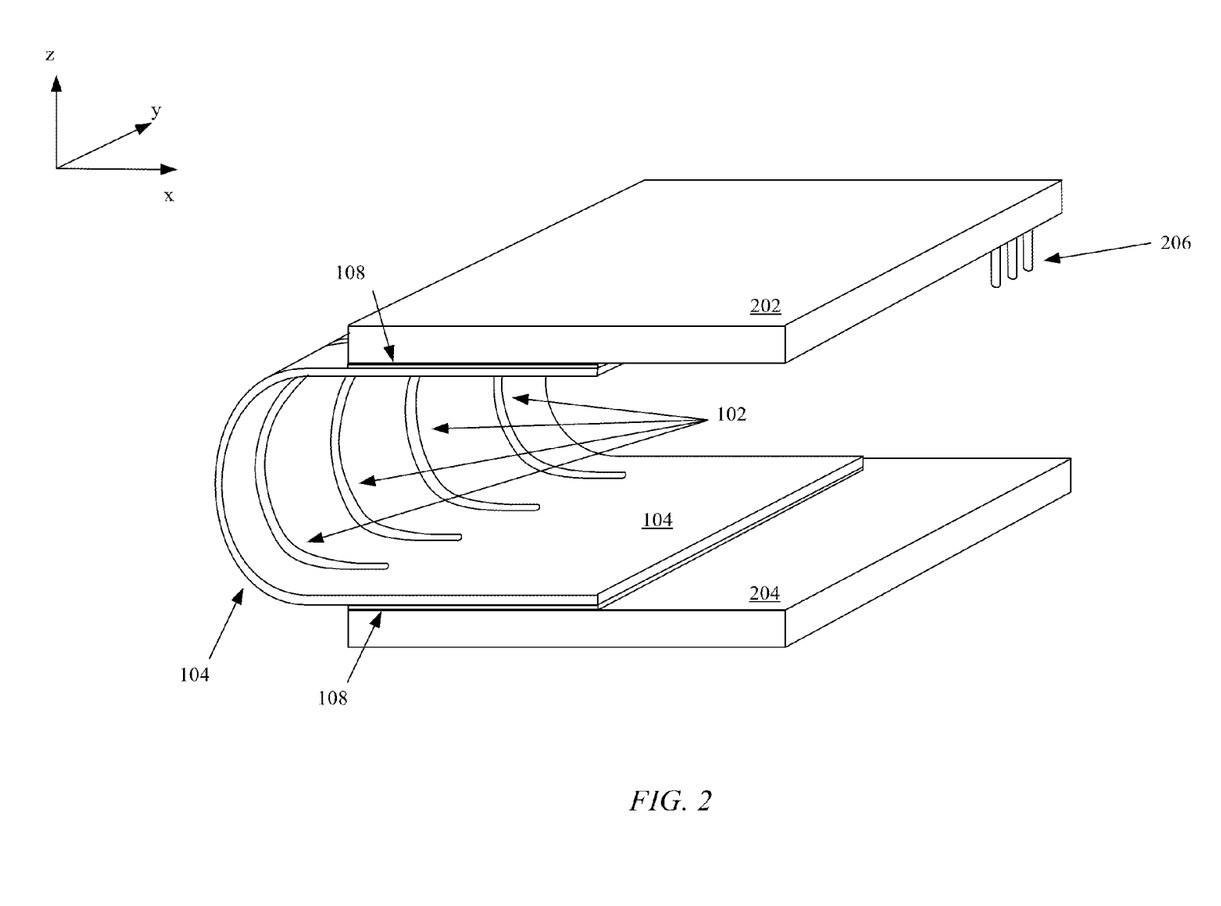
FIG. 2 shows a perspective view of the conductive connector described in FIG. 1 being used to electrically couple two conductive substrates together.

FIG. 2 shows a perspective view of single faced PSA tape 100 being used to electrically couple conductive substrates 202 and 204 together. Single faced PSA tape 100 is attached to conductive substrates 202 and 204 by way of adhesive surface regions 108. It should be noted that while adhesive surface regions 108 are depicted as separate elements extending outside of acrylic substrate 104, this is only done to illustrate a location of undeadened portions of acrylic PSA substrate 104. In this embodiment acrylic PSA substrate 104 is conductive; this conductivity can be achieved by introducing a matrix of conductive fillers within acrylic PSA substrate 104. In this way current can flow freely between conductive substrates 202 and 204. In one embodiment conductive substrates 202 and 204 can be made of sensor flex (also commonly referred to as flex circuit). Sensor flex technology allows electronic circuits to be printed upon a flexible conductive substrate, allowing the printed circuits to conform to a desired shape or even flex during routine use. Consequently, single faced PSA tape 100 is particularly well suited for use with flexible conductive substrates 202 and 204 since single faced PSA tape 100 applies a minimal amount of constraint upon otherwise unconstrained flexible conductive substrates 202 and 204. The use of flexible conductive substrates 202 and 204 can also simplify installation of single faced PSA tape 100. In one installation process flexible conductive substrate 202 can be rotated vertically into the Z-Y plane so that mating of adhesive surface region 108 to an upper surface of flexible conductive substrate 204 can be accomplished without interference from flexible conductive substrate 202. After single faced PSA tape 100 is adhesively fixed to conductive substrate 204 it can be easily adhered to flexible conductive substrate 202 since a lower surface of flexible conductive substrate 202 is no longer facing downwards in close proximity to flexible conductive substrate 204. Once single faced PSA tape 100 is adhesively fixed to both surfaces flexible conductive substrate 202 can be released, putting flexible conductive substrate back into the position depicted in FIG. 2.

Conductive substrate 202 can also includes connector 206. Connector 206 can be configured to enable communication between conductive substrate 202 and another device component (not shown). That other device can mate with connector 206 via a pin interface that forces conductive substrate 202 into a specific position. In manufacturing processes where conductive substrate 202 is attached via connector 206 to another device component after being electrically coupled to conductive substrate 204, conductive substrate 202 may have to shift in the XY plane in order to be properly seated. In some embodiments this shift can be as small as 0.5-1 mm. Such a shift in the XY Plane is possible since conductive substrates 202 and 204 are not rigidly connected by for example a conductive foam layer. Since acrylic substrate 104 is flexible, movement of conductive substrate 202 in the X-axis is readily accomplished. Relative motion between conductive substrates 202 and 204 can cause undesirable shearing forces to be applied to single faced PSA tape 100. Such forces over time can cause failure of adhesive connections between the conductive substrate layers. Slits 102 can substantially ease undesirable shearing forces by allowing segments of acrylic PSA substrate 104 to twist independently, thereby easing or removing any generated shearing forces that can otherwise be a factor. An increased amount of slits 102 can further reduce any stress from maneuvering in the Y-axis. In this way conductive substrates 202 and 204 can be electrically coupled with little or no mechanical force restricting their movement. Resulting geometry caused by relative movement in the X-Y Plane is depicted in FIGS. 3A-3C and described below.

Figure 3A:
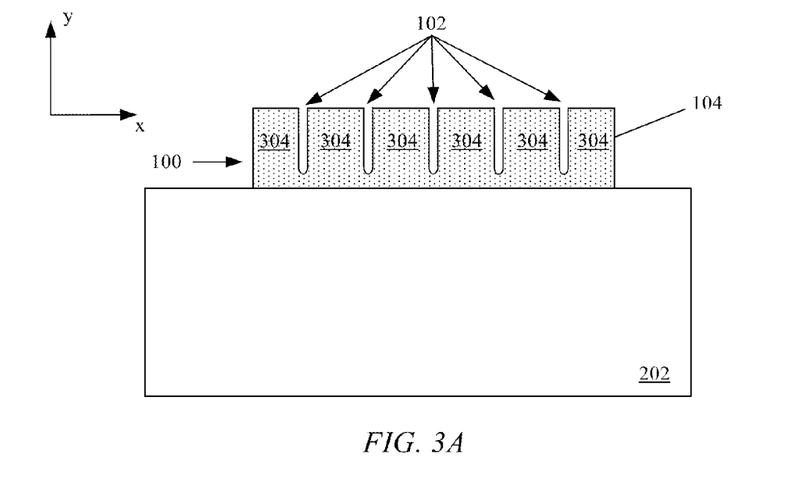
FIGS. 3A-3C show top views of the conductive connector described in FIG. 1 in which movement between two conductive substrates electrically coupled by a conductive connector is depicted.
Figure 3B:
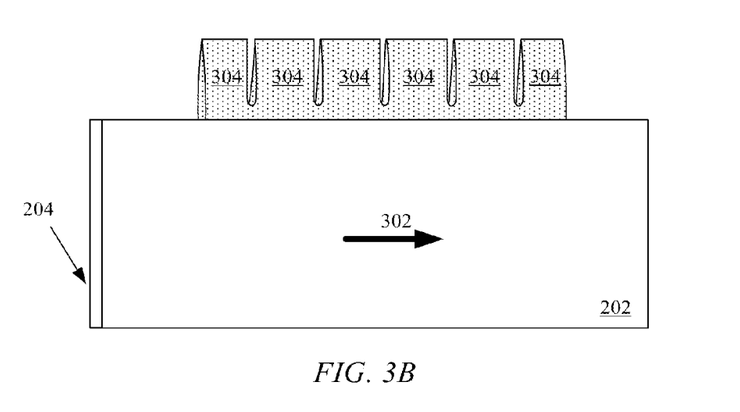
Figure 3C:
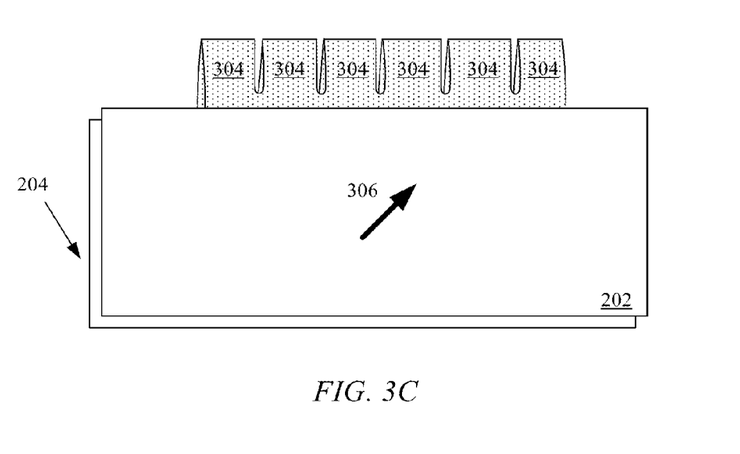

FIGS. 3A-3C show a top view of the conductive connector depicted in FIG. 2 in which movement between two conductive substrates electrically coupled by a conductive connector is depicted. FIG. 3A shows a top view of single faced PSA tape 100 attached to conductive substrate 202 before any movement takes place. Not shown is conductive substrate 204 located directly underneath and obscured by conductive substrate 202. Slits 102 are displayed running vertically through acrylic PSA substrate 104. In this depiction acrylic PSA substrate 104 contains a total of five slits 102, making acrylic PSA substrate 104 commensurably more flexible in the X-axis than a four slit configuration since independent acrylic substrate segments 304 are narrower than they would otherwise be in a four slit configuration.

FIG. 3B shows how single faced PSA tape 100 is affected by translation of conductive substrate 202 in the X-axis in a direction 302. After translation of conductive substrate 202 in direction 302 slits 102 are now angled towards the translation, not completely aligned as depicted in FIG. 3A. Likewise independent acrylic substrate segments 302 are also shown skewed towards direction 302. It should be noted that there can be a limit to the amount of translation possible in a given system. For example, excessive translation of conductive substrate 202 in the X-axis and/or Y-axis can cause single faced PSA tape to be stretched past its total length resulting in possible damage to single faced PSA tape 100 or disconnection from one or both of conductive substrates 202 and 204. In FIG. 3C a translation is depicted in direction 306 which involves translation in both the X and Y axes. Such a translation of conductive substrate 202 is certainly possible and within the scope of the embodiment described within this application. X and Y axis translation can happen in one axis at a time, or simultaneously in both the X and Y axes. While not apparent in this top view, conductive substrate 202 can also be translated in the Z-axis.

Figure 3D:
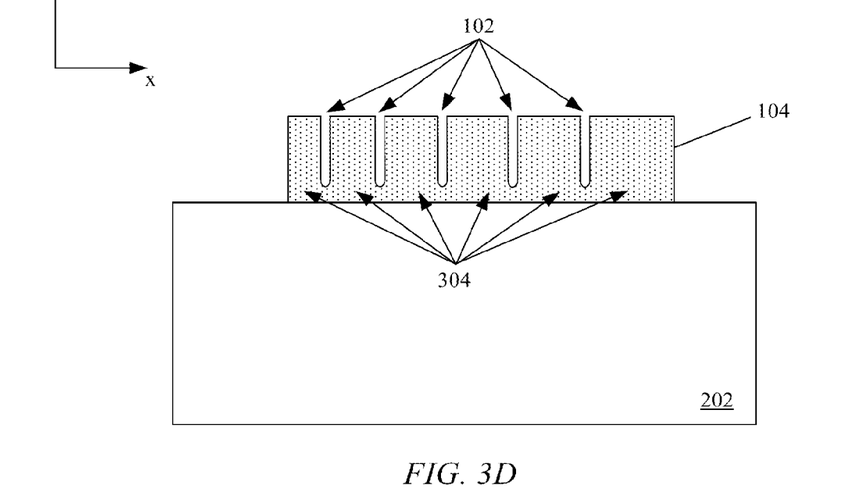
FIGS. 3D-3E show a top view of a conductive connector configured with irregularly spaced slits.
Figure 3E:
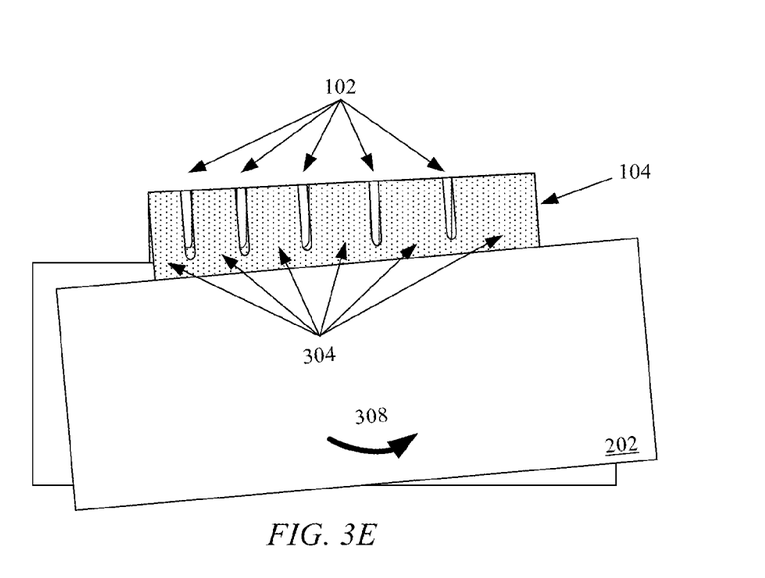

FIGS. 3D-3E show an alternative embodiment in which slits 102 are arranged at irregular intervals along the X-axis creating a variety of widths of independent acrylic substrate segments 304. Such a configuration can change an amount of resistance to forces applied along various portions of acrylic PSA substrate 104. In this particular depiction the irregular intervals are gradually increasing across the length of acrylic PSA substrate 104. FIG. 3E shows one example of how such a configuration can produce desirable results. When moment 308 causes conductive substrate 202 to rotate with respect to conductive substrate 204, independent acrylic substrate segments 304 become unevenly displaced. The irregular intervals of slits 102 can help to normalize any effect caused by this uneven displacement. Consequently, in an embodiment in which moment 308 is expected to act upon conductive substrate 202 independent acrylic substrate segments 304 can be arranged at a variety of widths to compensate for the uneven displacement. Moreover, slits 102 can be configured at differing angles and lengths to accommodate for any other unusual loading conditions that can be anticipated for a given design.

Figure 4A:
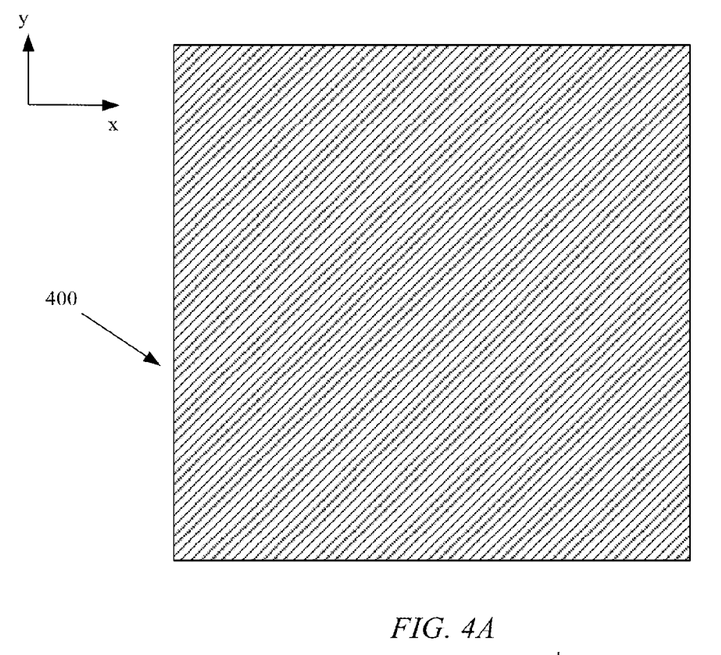
FIG. 4A shows a top view of a conductive sheet suitable for use as a component in an embodiment of a conductive connector.
Figure 4B:
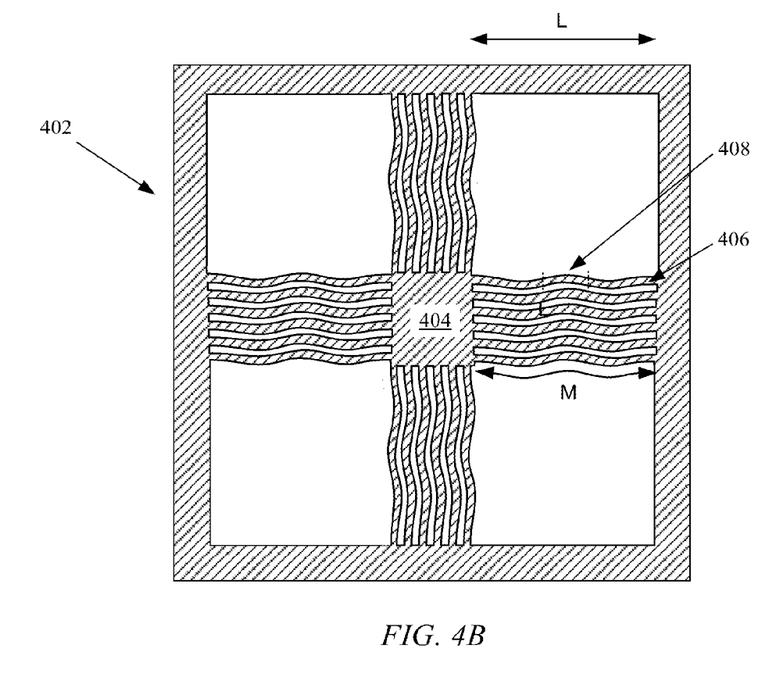
FIG. 4B shows how the conductive sheet depicted in FIG. 4A can be die cut.

FIGS. 4A-4D show how an alternate embodiment of a conductive connector can be produced. In FIG. 4A a conductive sheet 400 can be obtained. In one embodiment conductive sheet 400 can be made of a conductive film having high tensile strength, and dimensional stability. In FIG. 4B segments of conductive sheet 400 can be removed to form a border region 402 and a central region 404. Central region 404 can be connected to border region 402 by a number of conductive strands 406. While only four sets of conductive strands 406 are depicted, any number of conductive strands are possible. For example, a circular border region is possible having conductive strands 406 extending at regular intervals around central region 404. Conductive strands 406 can generally extend when stretched by providing strategically placed and sized curved regions along the lines of extending features 410. Each conductive strand 406 can generally include several extending features 410, although in some embodiments a limited number of strands can be completely linear and have no extending features. A conductive strand without extending features 410 can prevent relative movement in one direction as will be discussed in detail below. In the depiction shown by FIG. 4B extending feature 410 refers to a single curve in one of conductive strands 406. By die cutting conductive sheet 400 with extending features 410 an extended length of individual conductive strands 406 can be increased from Length L to Length M (greater than length L when stretched to its full length), when conductive strands 406 are stretched. This allows an increase in mobility of central region 404. It should be noted that while the extending features are depicted as curves they can also have a saw toothed shape, or any other non-linear feature tending to increase an extended length M of conductive strands 406.

Figure 4C:
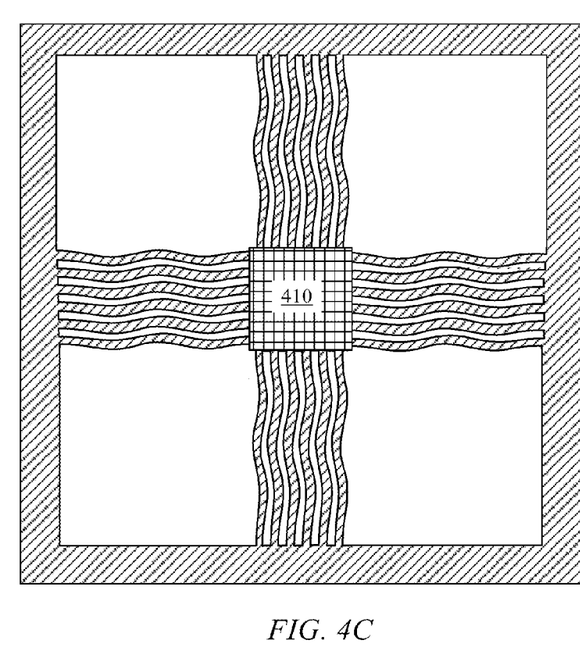
FIGS. 4C-4D show how pressure sensitive adhesive can be applied to the conductive sheet depicted in FIG. 4B to form an embodiment of the conductive connector.
Figure 4D:
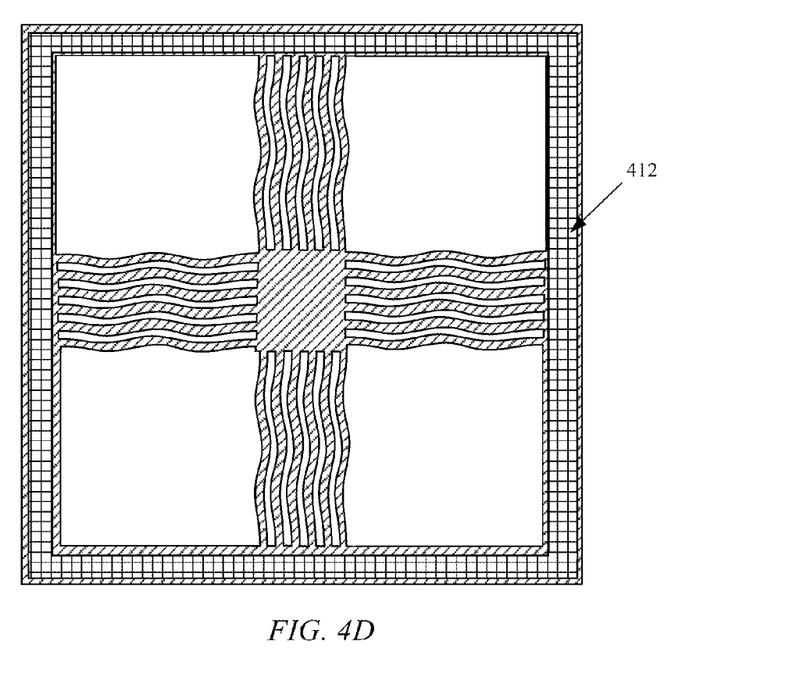
Figure 4E:
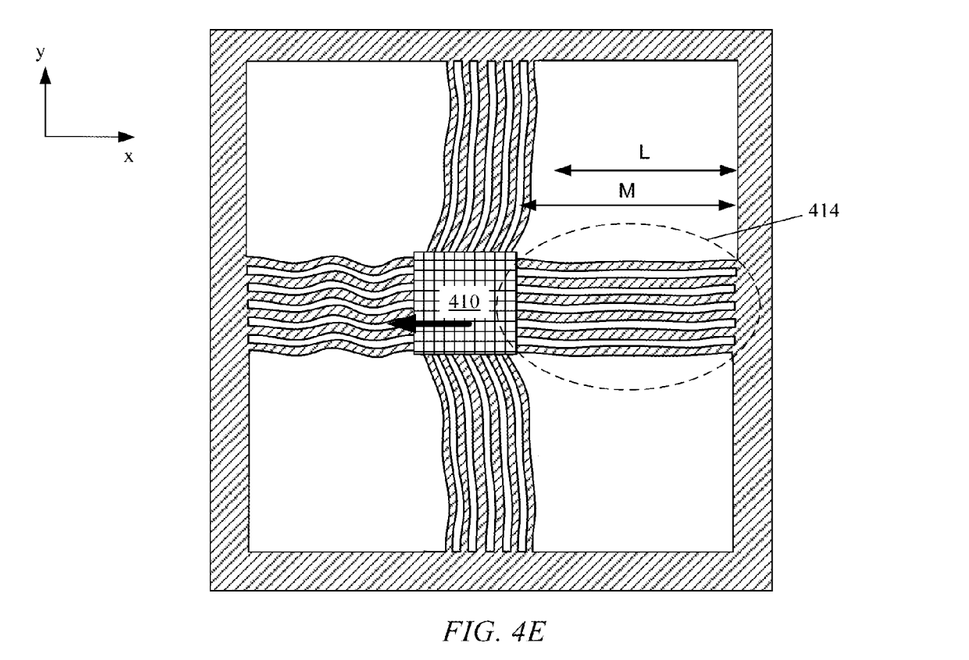
FIGS. 4E-4F show how a central region of a conductive sheet can be maneuvered in relation to a border region of the conductive sheet.
Figure 4F:
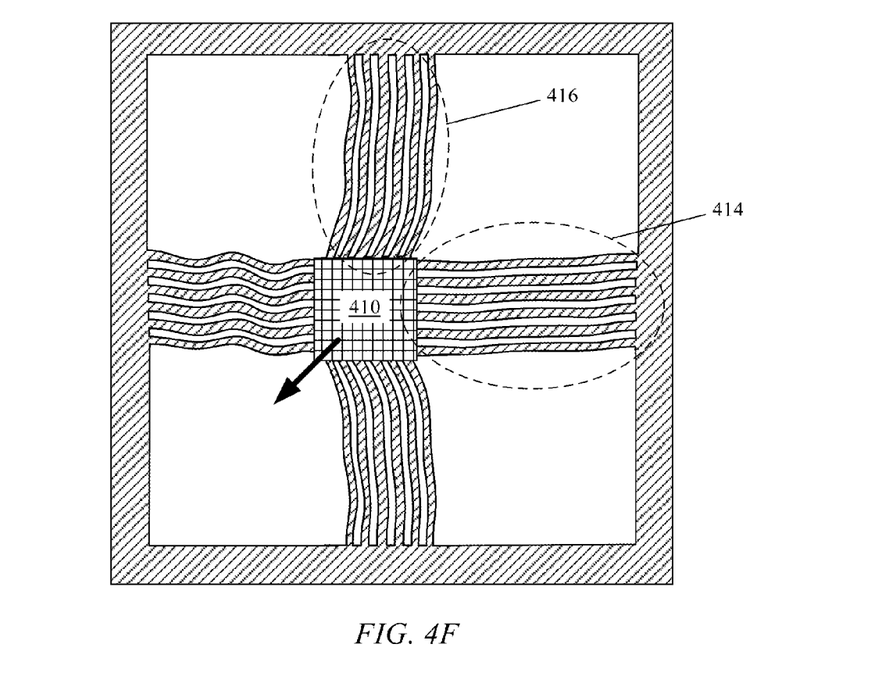
Figure 6A:
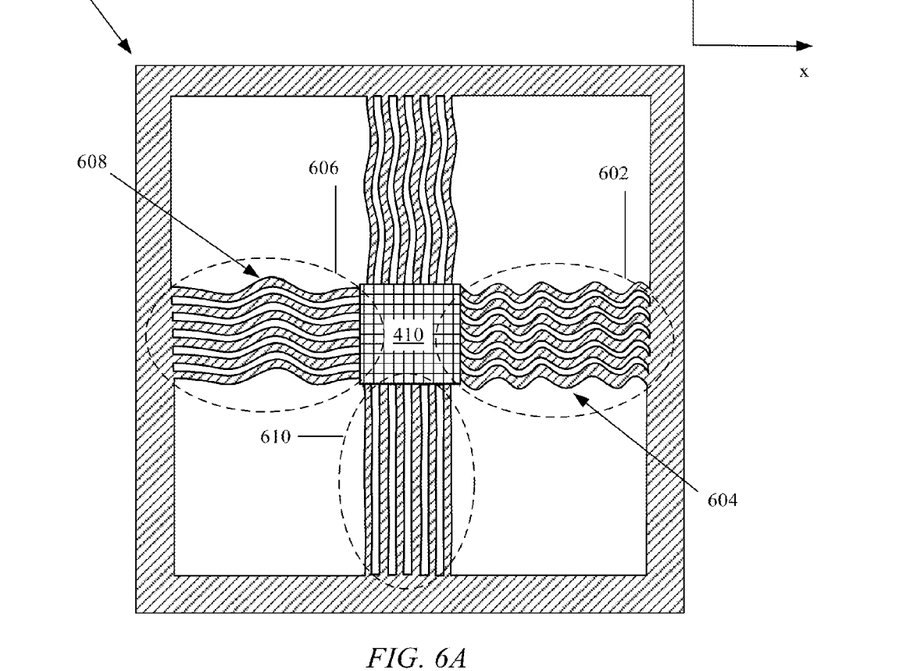
FIG. 6A shows a top views of a conductive connector embodiment having a variety of scoring patterns allowing for a number of different mechanical constraints depending on an axis of relative movement.

In FIG. 4C PSA patch 410 is shown having been affixed to central region 404. PSA patch 410 is a two sided piece of conductive PSA adhesively attached to central region 404. PSA patch 410 allows one side of conductive sheet 400 to be adhesively attached to a conductive substrate. After PSA patch 410 is affixed, FIG. 4D shows an opposite side of conductive sheet 400 having PSA ring 412 affixed to border region 402 of conductive sheet 400. PSA ring 412 is a two sided piece of conductive PSA conformably shaped to fit within border region 402 as depicted. PSA ring 412 can be used to affix conductive sheet 400 to another conductive substrate. The result is that two conductive substrates can be conductively coupled together by this conductive connector. FIG. 4E illustrates how conductive strands allow for movement of PSA patch 410 in relation to PSA ring 412. Translating PSA patch 410 in a negative X direction puts stress on conductive strands 414; this stress results in conductive strands 414 being extended when extending features 408 in conductive strands 414 are pulled into a linear configuration, thereby increasing conductive strands 414 length from a length L to a length M as depicted. Consequently, by varying size, shape and number parameters of extending features 408 of conductive strands 414 mechanical limits can be imposed on relative travel between PSA patch 410 and PSA ring 412. FIG. 4F illustrates an additional case in which PSA patch 410 can be translated in X and Y axes. In the depiction conductive strands 414 can be in an extended state from movement of PSA patch 410 in a negative X direction and conductive strands 416 can have extending features sufficient to allow extension of conductive strands 416 to accommodate the depicted movement of PSA patch 410 in a negative Y direction. In FIG. 6 below a conductive sheet 400 having a variety of differently configured extending features 410 will be depicted and discussed.

Figure 5A:
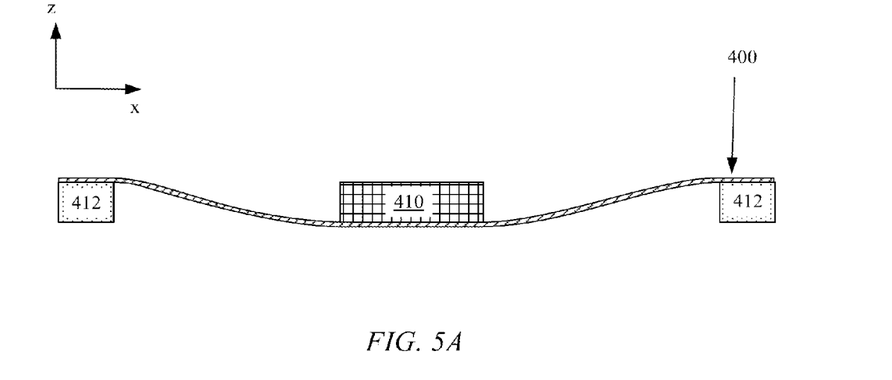
FIG. 5A shows a cross-sectional side view of the embodiment depicted in FIG. 4C.
Figure 5B:
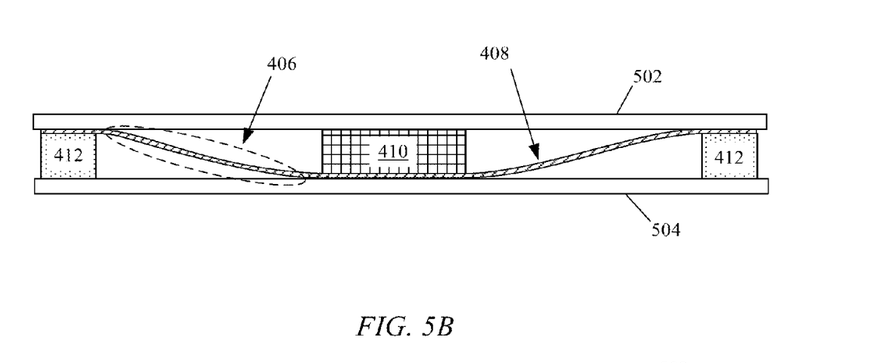
FIG. 5B shows a cross-sectional side view of the embodiment depicted in FIG. 5A, arranged between two conductive substrates.
Figure 5C:
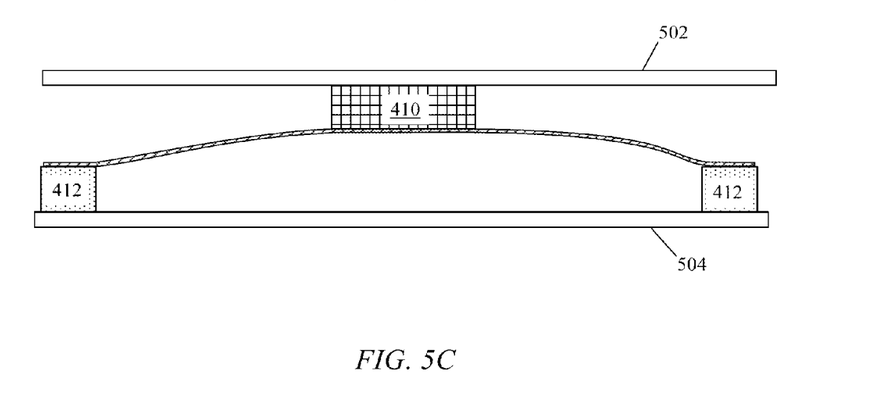
FIG. 5C shows a cross-sectional side view of the embodiment depicted in FIG. 5B, in which one element is shown shifted in two axes.

FIGS. 5A-5C show cross-sectional side views of the conductive connector depicted in FIGS. 4A-4F. In FIG. 5A a conductive connector is illustrated. In this figure relative Z height of conductive sheet 400, PSA patch 410 and PSA ring 412 are first illustrated. Because conductive sheet 400 is much shorter than PSA patch 410 and PSA ring 412 it can add very little to the overall height of the conductive connector. In FIG. 5B the conductive connector is depicted arranged between two conductive substrates 502 and 504. Because PSA patch 410 and PSA ring 412 are on opposite sides of conductive sheet 400, conductive substrate 504 is only adhesively attached to PSA patch 410 and conductive substrate 506 is only adhesively attached to PSA ring 412. It should be noted that extending features 408 can be rendered inoperable if pressure is exerted on it from above and below since depending on the amount of pressure exerted it can prevent extending features from extending; however, in this configuration extending features 410 are located in an open area between PSA patch 410 and PSA ring 412 Consequently, conductive substrates 502 can be maneuvered in X, Y, and Z axes since portions of conductive sheet 400 having extending features 410 are not trapped between conductive layers 502 and 504. FIG. 5C shows how conductive substrate 502 can be maneuvered in the Z axis. Z-axis motion can also be expanded by extending features 408, since expansion of extending features 410 can also allow conductive substrate 502 to be pulled farther away from substrate 504 as depicted, where PSA patch 410 has been maneuvered slightly in the X-axis and more substantially in the Z-axis when compared to its original position as depicted in FIG. 5B.

Figure 6B:
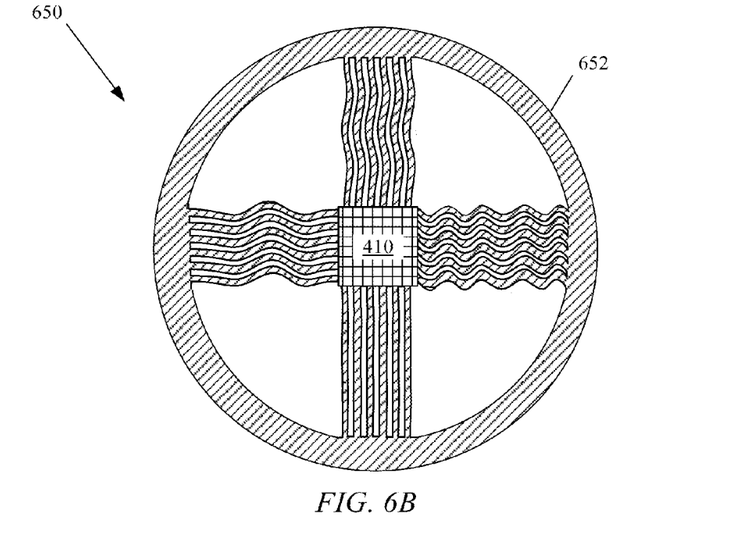
FIG. 6B shows a top view of a conductive connector embodiment having a circular border region.

FIGS. 6A and 6B show conductive connectors with varying extending feature patterns. FIG. 6A shows a conductive connector 600 with a rectilinear border region. Conductive strands 602 have tightly curved extending features 604. Extending features 604 having tight curves can give conductive strands 602 potential to reach a longer length when put under tension by movement of PSA patch 410. Another possible configuration of extending features is depicted with conductive strands 606 and extending feature 608. Extending features 608 have a large amplitude which provide additional extension for each of conductive strands 606 that would not be otherwise available with an extending feature that had a smaller amplitude. It should also be noted that conductive strands 606 have non uniform extending features. Extending features 608 are greater in magnitude than other extending features found along conductive strands 606. This can be desirable where certain levels of strength or distances of travel are desired. Moreover, although extending features have been generally depicted as curves, the extending features can also be configured in many other shapes such as for example: saw teeth, and sinusoids.

In this particular depicted embodiment PSA patch 410 can likely be maneuvered farther in a negative X direction than it can be maneuvered in a positive X direction due to the increased number of extending features in conductive strands 602. Conductive strands 610 are configured almost completely linearly without any distinct extending features. Consequently, PSA patch 410 cannot be maneuvered in a positive Y direction; however, due to the presence of extending features on an opposing set of conductive strands PSA patch 410 can be maneuvered in a negative Y direction. In this way conductive connector 600 is very useful when specific mechanical constraints are desired between two electrically coupled conductive substrates. For example, this embodiment can be used in a situation in which one of two attached conductive substrates is in a fixed position and another attached conductive substrate is not. This embodiment can put customized constraints on the unfixed conductive substrate, thereby preventing it from moving in a direction where it can enter a portion of an associated electronic device where the conductive substrate can be subjected to excessive heat. At the same time this embodiment can help the unfixed conductive substrate to move in another direction conducive to operations of the associated electronic device. It should be noted that the border region can assume different shapes than a simple square. In FIG. 6B conductive connector 650 is shown. Conductive connector 650 has border region 652 which is configured in a circular pattern. Consequently, an associated PSA ring would also be circular in shape. Alternative shapes can be highly desirable where the alternate shapes of the conductive connector match the area to which they are being applied. Many additional shapes are also possible including for example, polygons and ellipses. In this way conductive connectors can be shaped to fit nearly any area.

Figure 7A:
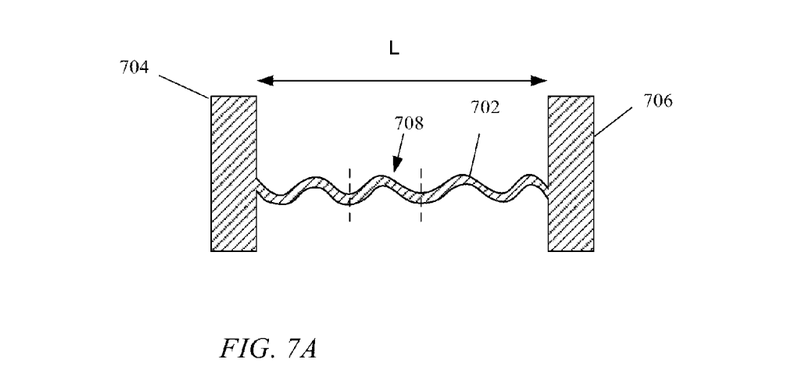
FIGS. 7A-7C show how a conductive strand can adjust to allow movement between a central region and a border region of a conductive sheet.
Figure 7B:
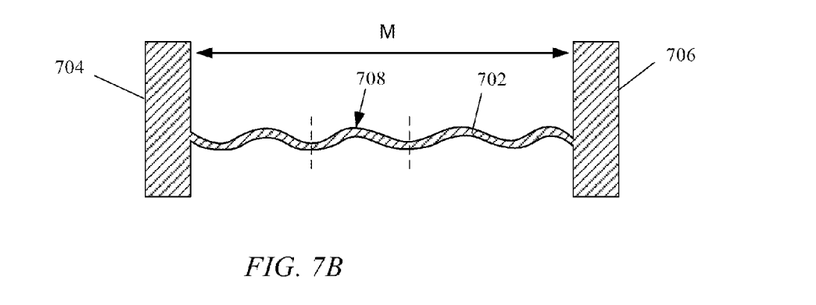
Figure 7C:
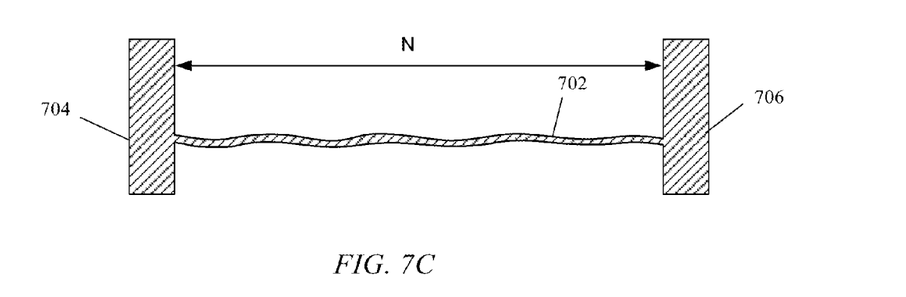

FIGS. 7A-7C illustrate how a conductive strand 702 can be adjustably extended when stressed. FIG. 7A shows a conductive strand 702 connecting a central region 704 and border region 706 of an associated conductive sheet (not shown in full). Conductive strand 702 follows a serpentine path between central region 704 and border region 706. Consequently, an overall point to point length L between central region 704 and border region 706 is less than the serpentine path followed by conductive strand 702. The serpentine path followed by conductive strand 702 can be any series of curves or non-linear features, depicted as extending features 708. The extending features can be repeating across the length of a conductive strand or can have extending features with varying geometries. In this figure conductive strand 702 is shown without any stress being applied to conductive strand 702. Stress is generally placed on conductive strand 702 by relative movement of central region 704 with respect to border region 706. FIG. 7B shows how central region 704 can be translated away from border region 706, thereby straightening the serpentine path followed by conductive strand 702 and increasing the overall point to point length L to a length M. As can be seen in FIG. 7B individual extending features 708 also extend and flatten as central region 704 moves farther away from border region 706. Finally, FIG. 7C shows central region 704 even farther from border region 706 at an overall point to point length N which is greater than length M. As depicted conductive strand 702 is near its maximum extension length since extending features 708 have been substantially flattened. A maximum extension length of the conductive strand can be used to impose a mechanical limit on an extension of the central region of the conductive sheet. It should be noted that since the serpentine path length remains the same throughout any of the aforementioned adjustments in overall point to point length that an overall electrical resistance between the central region and the border region will remain constant.

Figure 8:
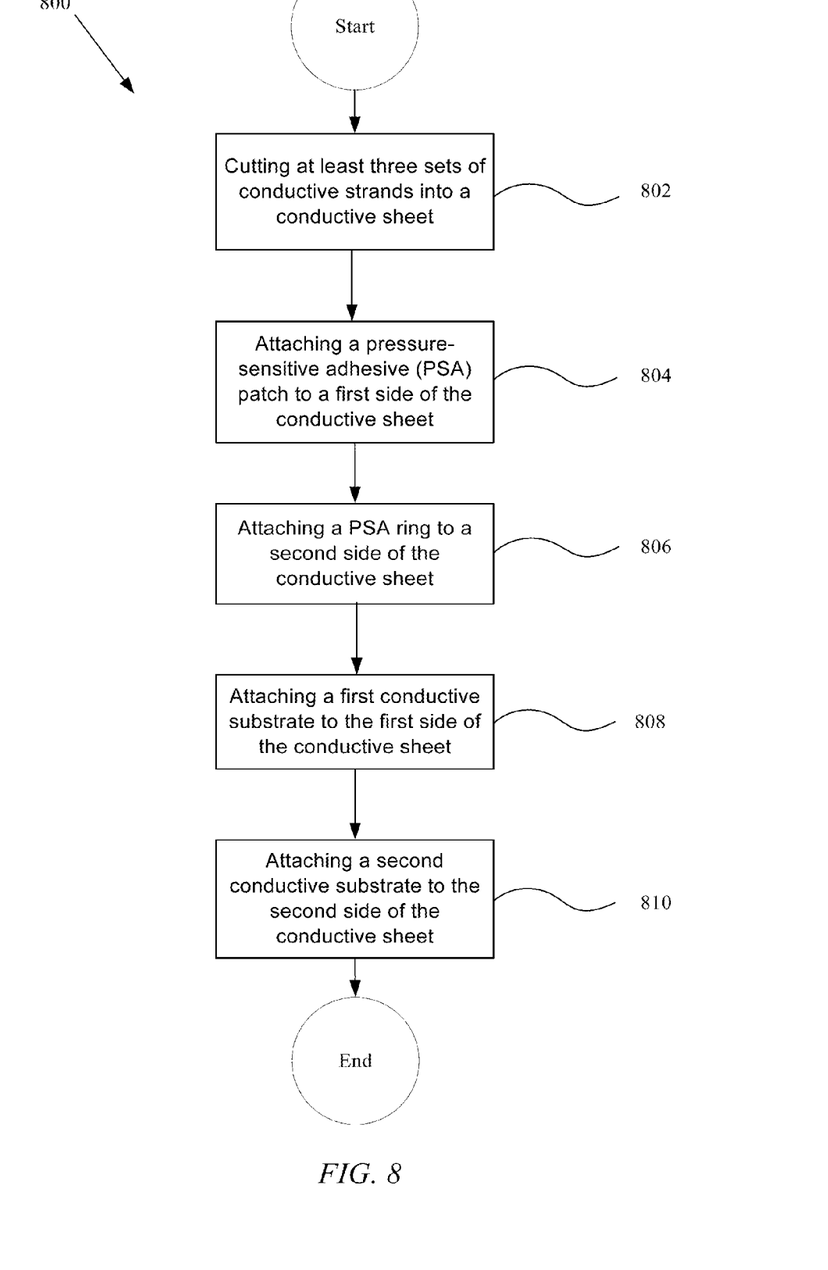
FIG. 8 shows a flow chart depicting a manufacturing process for creating and installing a conductive connector.

FIG. 8 shows a flow chart depicting manufacturing process 800. Manufacturing process 800 is for creating a flexible conductive connector and then installing it in an electronic device. In step 802 several cuts are made into a conductive sheet leaving at least three sets of conductive strands. The conductive strands link a remaining central region of the conductive sheet to a border region of the conductive sheet. The border region can be any shape suitable for placement in the location where it will be installed. It should also be noted that at least one of the sets of conductive strands includes at least one extending feature following a non-linear path between the border region and central region of the conductive sheet. In step 804 a pressure sensitive adhesive (PSA) patch is attached to a first side of the conductive sheet. The PSA patch is sized to match the central region of the conductive sheet. In step 806 a PSA ring is attached to a second side of the conductive sheet. The PSA ring is sized to fit within the border region of the conductive sheet. Once both the PSA ring and PSA patch have been attached to the conductive sheet a conductive connector is formed. In step 808 a first conductive substrate is attached to the first side of the conductive substrate. In some embodiments pressure should be applied to properly seat the adhesive from the PSA patch to the first conductive substrate. In step 810 a second conductive substrate is attached to the second side of the conductive sheet. In some embodiments pressure should be applied to properly seat the adhesive from the PSA ring to the second conductive substrate. When the two conductive substrates are attached in this manner they can be maneuvered in a three dimensional volume by virtue of the extending feature or features included in the conductive strands.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A floating conductive connector configured to electrically connect a first substrate and a second substrate, the floating conductive connector comprising:
   a conductive pad; and
   a conductive film, comprising:
      a central region coupled to the conductive pad,
      a border region, and
      a linking region, comprising a conductive strand spanning an adjustable distance, the conductive strand mechanically and electrically linking the border region to the central region, wherein the conductive strand has an electrical resistance that is maintained independent of a distance spanned by the conductive strand.

2. The floating conductive connector as recited in claim 1, wherein the conductive strand is formed by removing a plurality of portions from the conductive film, and wherein the electrical connection between the first and second substrates is maintained during relative motion of the first and second substrates.

3. The floating conductive connector as recited in claim 1, wherein the conductive strand follows a serpentine path between the border region and the central region, and wherein the adjustable distance spanned by the conductive strand increases when relative motion between the central region and the border region causes the serpentine path followed by the conductive strand to straighten.

4. The floating conductive connector as recited in claim 1, wherein the conductive connector comprises a plurality of conductive strands, and wherein a distance spanned by a first subset of the plurality of conductive strands has more adjustability than a second subset of the plurality of conductive strands.

5. The floating conductive connector as recited in claim 1, wherein the conductive pad is a conductive pressure-sensitive adhesive pad configured to couple the conductive film to the first substrate.

6. The floating conductive connector as recited in claim 3, wherein the serpentine path of at least one of the conductive strands follows a repeating sinusoidal pattern.

7. The floating conductive connector as recited in claim 3, wherein one portion of the serpentine path of at least one of the conductive strands has a saw tooth shape.

8. The floating conductive connector as recited in claim 5, wherein the plurality of conductive strands are aligned in at least three different directions.

9. A conductive connector suitable for electrically coupling a first component to a second component, the conductive connector comprising:
   a first region,
   a second region surrounding the first region, and
   a linking region joining the first region to the second region, the linking region comprising a conductive strand following a non-linear path between the first region and the second region, the conductive strand mechanically and electrically coupling the first region to the second region; and
   a conductive adhesive layer disposed on one side of the first region, the conductive adhesive layer configured to couple the conductive connector to the first component,
   wherein the conductive strand allows relative motion between the first region and the second region by allowing the non-linear path of the conductive strand to be straightened, which facilitates relative motion of the first region with respect to the second region in any of three dimensions.

10. The conductive connector of claim 9, wherein the linking region further comprises a plurality of conductive strands.

11. The conductive connector of claim 10, wherein each of the conductive strands follows a serpentine path between the first region and the second region.

12. The conductive connector of claim 9, wherein when the conductive connector electrically couples the first component to the second component, relative motion of the first region with respect to the second region allows the first component to shift relative to the second component without severing the electrical coupling.

13. The conductive connector of claim 10, wherein the plurality of conductive strands are oriented in at least 4 different directions.

14. The conductive connector of claim 13, wherein at least one of the plurality of conductive strands follows a linear path between the first region and the second region.

15. The conductive connector of claim 9, wherein the conductive connector is formed from a sheet of conductive film.

16. The conductive connector of claim 15, wherein the linking region is defined by removing a plurality of portions of film from the sheet of conductive film.

17. A connector suitable for electrically coupling a first component to a second component, the conductive connector comprising:
   an electrically conductive film, comprising:
      a central region,
      a border region surrounding the central region, and
      a linking region formed by removing portions of the electrically conductive film from an area of the electrically conductive film between the central region and the border region, wherein the linking region both mechanically and electrically couples the central region to the border region; and
   a conductive adhesive disposed on one side of the central region, the conductive adhesive configured to couple the conductive connector to the first component,
   wherein the linking region allows relative motion between the central region and the border region, which facilitates relative motion of the first component with respect to the second component without changing an electrical resistance of the connector.

18. The connector as recited in claim 17, wherein the linking region comprises a plurality of electrically conductive strands that follow a non-linear path between the central region and the border region.

19. The connector as recited in claim 18, wherein the plurality of electrically conductive strands are aligned in at least three different directions.

20. The connector as recited in claim 17, further comprising an adhesive layer affixed to one side of the border region of the electrically conductive film, the side of the border region being opposite the side of the central region, wherein the adhesive layer is configured to electrically and mechanically couple the connector to the second component.

* * * * *